(12) United States Patent
Numajiri et al.

(10) Patent No.: US 7,834,528 B2
(45) Date of Patent: Nov. 16, 2010

(54) PLANAR LUMINOUS BODY WITH IMPROVED LIGHT-EXTRACTION EFFICIENCY

(75) Inventors: Satoru Numajiri, Funabashi (JP); Kenichi Motoyama, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 1009 days.

(21) Appl. No.: 11/569,167

(22) PCT Filed: May 24, 2005

(86) PCT No.: PCT/JP2005/009481

§ 371 (c)(1),
(2), (4) Date: Nov. 16, 2006

(87) PCT Pub. No.: WO2005/115740

PCT Pub. Date: Dec. 8, 2005

(65) Prior Publication Data

US 2007/0267966 A1  Nov. 22, 2007

(30) Foreign Application Priority Data

May 26, 2004  (JP) .............................. 2004-155743

(51) Int. Cl.
 *H01K 1/30* (2006.01)
(52) U.S. Cl. ...................... 313/116; 313/474; 313/506
(58) Field of Classification Search ................. 313/474, 313/506, 116
See application file for complete search history.

(56) References Cited

FOREIGN PATENT DOCUMENTS

| JP | 59 5595 | 1/1984 |
|----|---------|--------|
| JP | 9 129375 | 5/1986 |
| JP | 61 156691 | 7/1986 |
| JP | 9 129375 | 5/1997 |
| JP | 10 235770 | 9/1998 |
| JP | 2001 202827 | 7/2001 |
| JP | 2003 216061 | 7/2003 |
| WO | 00 63924 | 10/2000 |

*Primary Examiner*—Joseph L Williams
*Assistant Examiner*—Fatima N Farokhrooz
(74) *Attorney, Agent, or Firm*—Oblon, Spivak, McClelland, Maier & Neustadt, L.L.P.

(57) ABSTRACT

A composite thin film-holding substrate for a surface light emitter, which is a transparent substrate including a composite thin film containing fine particles and a binder formed on the surface of a transparent base material. The refractive index of the composite thin film is higher than the refractive index of the transparent base material. The difference in the refractive index between the fine particles and the binder contained in the composite thin film is at least 0.1, and the ratio of (solid content mass of the fine particles)/(solid content mass of the binder+solid content mass of the fine particles) of the composite thin film is from 0.01 to 0.5. A surface light emitter can use the substrate.

23 Claims, 4 Drawing Sheets

PLANAR LUMINOUS BODY WITH IMPROVED LIGHT-EXTRACTION EFFICIENCY

TECHNICAL FIELD

The present invention relates to a surface light emitter to be used for various displays such as organic electroluminescence devices display devices, backlight and lighting for liquid crystal, etc., and a transparent substrate for such a surface light emitter.

BACKGROUND ART

Organic electroluminescence devices are devices which newly attract attention due to the increase in demands for flat displays in recent years. An organic electroluminescence device has merits as compared with liquid crystal devices which have been widely used as flat panel displays. Namely, since it is a self-luminous device/there is low dependence on the viewing angle, it consumes low electric power, and it can be made to be a very thin device. However, in order that it is used as a flat display it still has problems to be solved. One of them is a short emission lifetime of the device. If the lifetime is short, an image persistence phenomenon occurs such that when a still image is displayed on a flat display for a long time, there will be a difference in the luminance between lighting pixels and non-lighting pixels whereby image persistence is visually observed. There are various factors involved in the emission lifetime, and it has been known that the lifetime becomes shorter when a higher voltage is applied to the device to increase the emission luminance. However, the emission luminance of a display employing an organic electroluminescence device is not satisfactory in a state where a low voltage is applied, and in order to secure visibility in the daytime outside, it is required to apply a high voltage to the device thereby to increase the emission luminance. Therefore, an organic electroluminescence device is in the dilemma of having a decreased emission luminance so as to prolong the lifetime or of having a short lifetime when it is desired to increase the visibility.

In order to solve this problem, improvement of a luminous layer material for an organic electroluminescence device has been actively in progress. Namely, it is to develop a luminous layer material having a high internal quantum efficiency so as to realize high emission luminance with an application of a lower voltage.

Further, in order to improve the luminous efficiency of an organic electroluminescence device, it is required to improve the light-extraction efficiency in addition to improving the internal quantum efficiency.

The light-extraction efficiency is the proportion of light emission discharged to the air from the front of a transparent substrate of the device relative to the light emission of the device. That is, in order that the light emission in the luminous layer is discharged to the air, the light has to pass through interfaces of several mediums differing in the refractive index. According to the Snells law of refraction a light which has entered each interface at an angle of the critical angle or more, is totally reflected on the interface, is guided into the layer and disappears, or is emitted through the side surfaces of the layer, and light emission from the front of the device will reduce correspondingly.

Accordingly an improvement of the light-extraction efficiency is an important object, and various attempts have been conducted. A device in which grain boundaries are formed on a transparent electrode or a luminous layer so that visible light is scattered (see Patent Document 1), a device which employs, as a transparent substrate, a glass substrate having one surface roughened so that emitted light is scattered (see Patent Document 2) and a device in which a scattering region is provided in the vicinity of an interface between an electrode and an organic layer (see Patent Document 3) are disclosed. However, all these attempts may disturb the film thicknesses of the respective layers of the device, and may cause dielectric breakdown and non-uniformity of the emission of the device, and are unsatisfactory in view of the mass productivity of the device.

Further, in general, the light-extraction efficiency is considered to be improved by forming, at an interface between a transparent base material and a transparent electrode, a layer having a refractive index lower than that of the transparent base material. The refractive index of such a layer is preferably lower than that of the transparent base material by from 0.01 to 0.5 for example, preferably from 0.05 to 0.3. The refractive index of the layer itself is usually from 1.2 to 1.4, preferably from 1.2 to 1.35, more preferably from 1.25 to 1.3. Specifically, a device in which a light emitter is formed on a transparent base material having a surface layer (silica aerosol) having a low refractive index formed thereon, to reduce the loss by light guiding in the transparent base material (see Patent Document 4) and a device in which a light emitter is formed on a transparent base material having a layer with a low refractive index to be obtained by a composite thin film employing fine hollow particles, fine aerogel particles and a silica porous body, so as to reduce the loss by light guiding in the transparent base material (see Patent Document 5, are disclosed.

In these documents, the light-extraction efficiency is improved by forming a thin film light emitter on a thin film having a low refractive index. In the case of a light emitter having a thickness smaller than the wavelength of light, the light guiding in the luminous layer is restricted, whereby the amount of light which can be emitted to the surface of the luminous layer will increase.

However, in the case of using a transparent base material having a surface layer with a low refractive index, if the thickness of the transparent electrode is 150 nm, the influences of the light passing through the transparent electrode can not be ignored, and although the amount of light totally reflected between glass and the surface layer with a low refractive index will reduce, the amount of light which has been emitted from the light emitter, totally reflected between the surface layer with a low refractive index and the transparent electrode will increase, and thus no significant improvement in the light-extraction efficiency can be expected.

Patent Document 1: JP-A-59-005595
Patent Document 2: JP-A-61-156691
Patent Document 3: JP-A-09-129375
Patent Document 4: JP-A-2001-202827
Patent Document 5: JP-A-2003-216061

DISCLOSURE OF THE INVENTION

Object to be Accomplished by the Invention

Therefore, a thin film such that an effect of improving the luminous efficiency can be expected by forming the thin film on the surface of a transparent base material, regardless of the type of the base material, as compared with the above-described prior art, which can be preferably produced easily at a low cost, is desired.

The present invention has been made under these circumstances, and its object is to provide a transparent substrate for a surface light emitter, which can improve the light-extraction efficiency of a surface light emitter to be used for e.g. various displays represented by organic electroluminescence devices display devices, backlight and lighting for liquid crystal etc., and to provide a surface light emitter with a high light-extraction efficiency by using the transparent substrate.

Means to Accomplish the Object

The present invention resides in a transparent substrate (composite thin film-holding substrate) comprising a composite thin film (light-extraction film) containing fine particles and a binder formed on a transparent base material, and it was found that the object can be achieved by effective scattering on the surface and in the interior of the composite thin film in a region where the refractive index of the composite thin film is higher than the refractive index of the transparent base material.

According to a first aspect of the present invention, there is provided a composite thin film-holding substrate for a surface light emitter, which is a transparent substrate comprising a composite thin film containing fine particles and a binder formed on the surface of a transparent base material, wherein the refractive index of the composite thin film is higher than the refractive index of the transparent base material, the difference in the refractive index between the fine particles and the binder contained in the composite thin film is at least 0.1, and the ratio of (solid content mass of the fine particles)/(solid content mass of the binder+solid content mass of the fine particles) of the composite thin film is from 0.01 to 0.5.

Here, scattering on the surface of the composite thin film occurs between the air and the composite thin film due to irregularities on the surface of the film, and this is a phenomenon caused by a difference in the refractive index between the air and the composite thin film. In order to obtain the effect of the scattering on the surface, the proportion of the fine particles in the composite thin film is preferably high. Therefore, as the mixing ratio of the fine particles and the binder, the proportion (mass ratio) of the fine particles contained in the solid content of a coating material (a material to form the composite thin film containing fine particles and a binder forming material) as represented by (solid content mass of the fine particles)/(solid content mass of the binder+solid content mass of the fine particles), is preferably from about 0.2 to about 0.5. On the other hand, in order to obtain scattering in the interior, preferred is such a state that there is sufficient space between particles and that the space is filled with the binder. Accordingly the proportion (mass ratio) of the fine particles contained in the solid content of the coating material represented by (solid content mass of the fine particles)/(solid content mass of the binder+solid content mass of the fine particles) is preferably from about 0.01 to about 0.2.

Now, preferred embodiments of the first aspect of the present invention will be described below.

The fine particles are fine metal oxide particles or fine organic polymer particles.

In a case where the fine particles are fine metal oxide particles preferably they are fine particles of at least one metal oxide selected from the group consisting of silica, titania, tin oxide, zinc oxide, cerium oxide, aluminum oxide, indium oxide and a composite oxide thereof.

Further, the fine particles are particularly preferably fine silica particles. The average particle size of the fine silica particles is preferably from 10 to 1,000 nm, and the average particle size is preferably at least 80 nm, more preferably at least 200 nm.

The reason is that scattering on the surface and in the interior of the composite thin film has to be achieved in order that the light-extraction efficiency is significantly improved. In order to achieve scattering on the surface of the composite thin film, the particle size of the fine particles is preferably at least 80 nm. It was found that the effect of scattering increases as the particles become large. Further, it was found that the particle size is preferably at least about 200 nm in order to achieve scattering in the interior of the composite thin film.

The binder is a metal oxide or an organic polymer.

In a case where the binder is a metal oxide, preferably it is at least one metal oxide selected from the group consisting of silica, titania, tin oxide, zinc oxide, cerium oxide, aluminum oxide and a composite oxide thereof.

Here, in order to achieve scattering between the fine particles and the binder in the composite thin film, the refractive index of the fine particles has to be different from that of the binder. If there is a difference in the refractive index between them, either one may be high.

In the composite thin film-holding substrate for a surface light emitter according to the first aspect of the present invention, by forming a composite thin film obtained from a coating material containing fine particles and a binder differing in the refractive index by at least 0.1, on the surface of a transparent base material, the light-extraction efficiency can be significantly improved. When light passes through the composite thin film, it will be scattered on the surface of the film and in the interior of the film. By this effect, in a case where a light emitting device is provided on the composite thin film of this composite thin film-holing substrate for a surface light emitter, the light guided into the light emitting device tends to reduce, and the extraction efficiency of the light passing through the composite thin film, from the transparent base material to the outside (the air) will be high.

In the composite thin film-holding substrate for a surface light emitter according to the first aspect of the present invention in a case where the refractive index of the fine particles forming the composite thin film is 1.38 and the refractive indices of the binder are 1.60 and 1.82, when the proportions of the fine particles contained in the coating material, as represented by the solid content mass of the fine particles/(solid content mass of the binder+solid content mass of the fine particles) are 0.5, 0.2 and 0.066, the refractive indices of the composite thin film are 1.49, 15.6 and 1.59, and 1.60, 1.73 and 1.79, respectively, as calculated from [refractive index of the film=(solid content mass ratio of the fine particles)×1.38+ (solid content mass ratio of the binder)×(refractive index of the binder)] to obtain approximate values. That is, the refractive index of the composite thin film is equal to or higher than the refractive index (1.4 to 1.6) of many transparent base materials. Also in a case where the refractive index of the film is higher than that of the transparent base material, the extraction efficiency of the light passing through the composite thin film from the transparent base material to the outside (the air) will be high.

In a composite thin film-holding substrate for a surface light emitter comprising a thin film having the same refractive index as that of the above composite thin film, containing no fine particles and having a smooth surface, formed on a transparent base material, no effect of increasing the extraction efficiency of the light passing through the composite thin film-holding substrate for a surface light emitter, from the transparent base material to the outside (the air), is obtained at all.

In the composite thin film according to the first aspect of the present invention, when the particle size of the particles used is at least 200 nm, scattering will occur more actively, and a higher effect of improving the light-extraction efficiency of the composite thin film containing fine particles and a binder will be achieved.

In the composite thin film according to the first aspect of the present invention, by forming a thin film obtained from a coating material containing fine particles and a binder differing in the refractive index by at least 0.3, a higher effect of improving the light-extraction efficiency of the composite thin film containing fine particles and a binder will be achieved.

In the composite thin film according to the first aspect of the present invention, when the fine particles and the binder properly coexist in the film so that the proportion of the fine particles contained in the solid content of the coating material, as represented by (solid content mass of the fine particles)/(solid content mass of the binder+solid content mass of the fine particles) is about 0.2, a higher effect of improving the light-extraction efficiency of the composite thin film containing fine particles and a binder will be achieved.

According to a second aspect and a third aspect of the present invention, there is provided the composite thin film-holing substrate for a surface light emitter as defined in the first aspect, comprising a planarized film formed on the surface of the composite thin film containing fine particles and a binder to scatter the light, by using a planarizing material containing e.g. an organic polymer and a metal oxide, so that irregularities on the surface of the composite thin film are reduced or the surface is planarized.

According to the second aspect of the present invention, there is provided the thin film-holding substrate for a surface light emitter as defined in the above first aspect, comprising a planarized film formed on the surface of the composite thin film containing fine particles and a binder, of which the ratio of (solid content mass of the fine particles)/(solid content mass of the binder+solid content mass of the fine particles is at least 0.01 and at most 0.2. In a case where the surface is planarized or the irregularities are reduced, when the proportion of the fine particles contained in the solid content of the coating material as represented by the solid content mass of the fine particles in the composite thin film/(solid content mass of the binder+solid content mass of the fine particles) is at least 0.01 and at most 0.2, although an effect of improving the light-extraction efficiency will be achieved even when the refractive index of the planarizing material is equal to the refractive index of the composite thin film containing fine particles and a binder, the refractive index of the planarizing material is preferably different from the refractive index of the composite thin film. It was found that in a case where irregularities on the surface of the film are lost by planarizing the surface of the composite thin film or reducing the irregularities, if there is no or substantially no difference in the refractive index between the planarized film and the composite thin film, scattering on the surface of the film is lost, and if there is a difference in the refractive index between the planarized film and the composite thin film, there is an effect of scattering corresponding to the difference in the refractive index. It was found that the effect of scattering is more significant as the difference in the refractive index is greater. The greatest difference in the refractive index is achieved when there is no planarized film as the refractive index of the air is 1, and the greatest effect will be obtained in such a case.

In the second aspect of the present invention, if the refractive index of the planarized film formed on the composite thin film of the composite thin film-holding substrate for a surface light emitter is equal to the refractive index of the composite thin film, the effect of improving the light-extraction efficiency by scattering on the surface of the film will significantly decrease. If the refractive index of the planarized film is significantly different from the refractive index of the composite thin film, the effect will be maintained although it is decreased. No effect of improving the light-extraction efficiency will be achieved when the refractive index of the composite thin film itself containing fine particles and a binder having substantially the same refractive index, is substantially equal to the refractive index of the planarized film. Therefore, it is considered that the effect will be maintained by scattering in the interior of the film in the case of the composite thin film of the first aspect. The effect of improving the light-extraction efficiency varies depending upon the degree of the difference in the refractive index between the composite thin film and a layer covering the film, and the difference in the refractive index between the air and the composite thin film is the greatest, and accordingly the greatest effect to be achieved when there is no layer covering the composite thin film.

According to the third aspect of the present invention, there is provided the composite thin film-holding substrate for a surface light emitter as defined in the above first aspect, comprising a planarized film differing in the refractive index from the composite thin film by at least 0.2 formed on the surface of the composite thin film containing fine particles and a binder, of which the ratio of (solid content mass of the fine particles)/(solid content mass of the binder+solid content mass of the fine particles) is higher than 0.2 and at most 0.5. When the proportion of the fine particles contained in the solid content in the coating material represented by the solid content mass of the fine particles in the composite thin film/(solid content mass of the binder+solid content mass of the fine particles) is higher than 0.2 and at most 0.5, the refractive index of the planarized film is preferably different from the refractive index of the composite thin film containing fine particles and a binder by at least 0.2.

In the third aspect of the present invention, in a case where the refractive index of the planarized film formed on the composite thin film of the composite thin film-holding substrate for a surface light emitter is equal to the refractive index of the composite thin film, the effect of the improving the light-extraction efficiency by scattering on the surface of the film will significantly decrease, but if the refractive indices are significantly different from each other, the effect will be maintained. The decrease is smaller than when a planarized layer is formed on the composite thin film according to the second aspect, since scattering is more significant when the amount of the binder in the interior of the film is larger. Since the effect of improving the light-extraction efficiency varies depending upon the degree of the difference in the refractive index between the composite thin film and a layer covering the film and the difference in the refractive index between the air and the composite thin film is the greatest, the greatest effect will be achieved when there is no layer covering the composite thin film. Further, by formation of the planarized layers the haze value will reduces that is, whitening will be reduced, the thin film will be more transparent, and favorable color reproducibility will be achieved but the effect of improving the light-extraction efficiency will be maintained.

Now, preferred embodiments of the second and third aspects will be described below.

The planarized film on the composite thin film is made of a metal oxide or an organic polymer.

In a case where the planarized film on the composite thin film is made of a metal oxide, preferably the metal oxide is at least one metal oxide selected from the group consisting of silica, titania, tin oxide, zinc oxide, cerium oxide, aluminum oxide and a composite oxide thereof.

In a case where the planarized film on the composite thin film is made of an organic polymer, preferably the organic polymer is at least one organic polymer selected from the group consisting of a silicone resin, an acrylic resin, a styrene resin, a polyimide resin and a polyamide resin.

According to a fourth aspect of the present invention, there is provided the composite thin film-holding substrate for a surface light emitter as defined in the above first aspect, which further comprises a transparent electrically conductive film formed on the composite thin film containing fine particles and a binder.

According to a fifth aspect of the present invention, there is provided the composite thin film-holding substrate for a surface light emitter as defined in the above second or third aspect, which further comprises a transparent electrically conductive film formed on the planarized film.

Now, preferred embodiments of the second third and fifth aspects will be described below.

The fine particles are fine silica particles, the binder is a silica/titania composite oxide, and the planarized film on the composite thin film is made of silica.

According to a sixth aspect of the present invention, there is provided a surface light emitter comprising the composite thin film-holding substrate for a surface light emitter as defined in the above first aspect, and a phosphor thin film multilayered on the surface of the composite thin film containing fine particles and a binder.

In the surface light emitter according to the sixth aspect of the present invention, an organic or inorganic phosphor thin film which is excited by ultraviolet rays or electron rays and emits light is formed on the composite thin film of the composite thin film-holding substrate for a surface light emitter whereby a surface light emitter with a high light-extraction efficiency to the outside will be obtained. The light-extraction effect is attributable to the effect of the composite thin film, an effect such that the surface area to which ultraviolet rays or electron rays are applied is increased by irregularities on the surface, and a synergistic effect thereof.

According to a seventh aspect of the present invention there is provided a surface light emitter comprising the composite thin film-holding substrate for a surface light emitter as defined in the above second or third aspect, and a phosphor thin film multilayered on the surface of the planarized film.

According to an eighth aspect of the present invention, there is provided a surface light emitter comprising the composite thin film-holding substrate for a surface light emitter as defined in the above fourth or fifth aspect, and an electroluminescence device constituted on the surface of the transparent electrically conductive film.

According to the eighth aspect of the present invention, a transparent electrically conductive film, a luminous layer and a metal electrode are multilayered in this order on the composite thin film of the composite thin film-holding substrate for a surface light emitter as defined in the above first aspect or on the planarized film of the composite thin film-holding substrate for a surface light emitter as defined in the second or third aspect to constitute an electroluminescence device, whereby a surface light emitter with a high light-extraction efficiency to the outside can be obtained.

Here, the composite thin film is a coated film remaining on the transparent base material after the transparent base material is coated with a liquid coating material containing fine particles and a binder-forming material to form a coating, which is dried. Drying means to remove a liquid component (or a volatile component) from the coating so that a solid coated film remains, and drying may be carried out with heating as the case requires. Further, heat treatment may be carried out by heating the coated film after drying, or heat treatment may be applied to the coated film by carrying on the heating for drying. After drying, irradiation with UV may be carried out, and heat treatment may further be carried out after irradiation with UV.

Effects of the Invention

It is to provide a transparent substrate for a surface light emitter capable of improving the light-extraction efficiency of a surface light emitter to be used for various displays represented by organic electroluminescence devices, display devices, backlight and lighting for liquid crystal, etc., and to provide a surface light emitter with a high luminous efficiency by using the transparent substrate.

Figure 1:
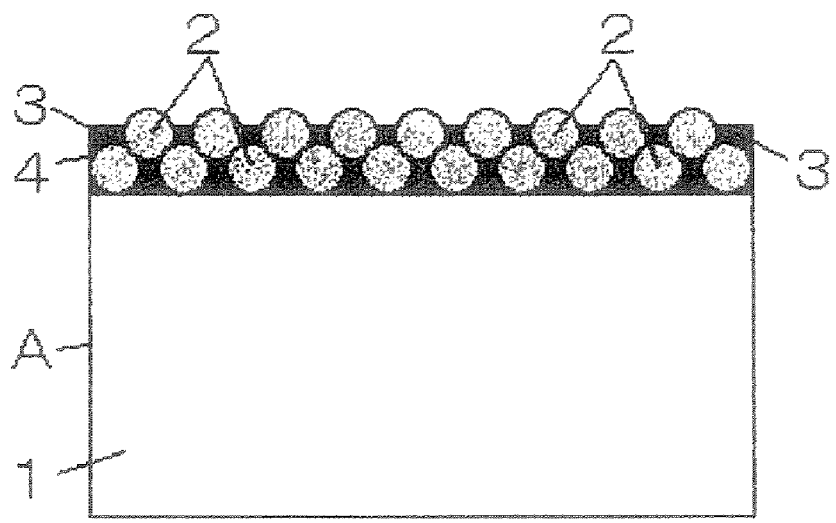
FIG. 1 is a sectional view schematically illustrating one example of the composite thin film-holding substrate for a surface light emitter of the present invention.

| | MEANING OF SYMBOLS |
|---|---|
| 1: | Transparent base material |
| 2: | Fine particles |
| 3: | Binder |
| 4: | Composite thin film (light-extraction film) |
| 5: | Planarized film |
| 6: | Phosphor thin film |
| 7: | Transparent electrically conductive film |
| 8: | Luminous layer |
| 9: | Metal electrode |
| 10: | Electroluminescence device |
| 11: | Hole transport layer |
| 12: | Electron transport layer |

BEST MODE FOR CARRYING OUT THE INVENTION

In the composite thin film-holding substrate for a surface light emitter of the present invention the transparent base material is not particularly limited so long as it is translucent, and it is usually in the form of a sheet or a plate. The transparent base material may, for example, be a transparent glass plate or a transparent plastic plate, and it is not particularly limited so long as it is commonly used as a translucent plate. The refractive index of the transparent base material is within a range of from 1.46 to 1.6 in many cases.

For the thin film-holding substrate for a surface light emitter of the present invention, the material to be used for the fine particles to be contained in the composite thin film may, for example, be fine organic polymer particles or fine metal oxide particles. Further, the material to be used for the binder may, for example, be a metal oxide or an organic polymer. From these materials to be used, the combination of the fine particles or a fine particle-containing solution and the binder is selected so as to satisfy the above described requirements. Now, the fine particles and the binder will be described below.

As the fine particles to be contained in the composite thin film of the present invention, fine particles of a metal oxide may be used.

As the metal oxide, first, fine silica particles may be mentioned. The average particle size of the fine silica particles is preferably within a range of from 10 nm to 1,000 nm. Particularly in order to achieve the effect of scattering on the surface of the film, the average particle size is preferably at least 80 nm, and further, in order to achieve the effect of scattering in the interior of the film, it is preferably at least 200 nm. The particle size employed in the present invention is an average particle size measured by dynamic light scattering method. A measuring apparatus may, for example, be DLS-7000 manufactured by OTSUKA ELECTRONICS CO., LTD. As a metal oxide to be used in the same manner as the fine silica particles, fine particles of at least one metal oxide selected from the group consisting of titania, tin oxide, zinc oxide, cerium oxide, aluminum oxide, indium oxide, zirconium oxide and a composite oxide thereof may, for example, be mentioned. As fine metal oxide particles preferably used, fine particles of at least one metal oxide selected from the group consisting of titania, tin oxide, indium oxide and a composite oxide thereof may, for example, be mentioned. As fine metal oxide particles particularly preferably used, in a case where ones having a high refractive index are selected, fine titania particles or fine indium tin oxide particles may, for example, be mentioned. A desired refractive index of the fine metal oxide particles can be attained by selecting the material per se.

As the fine particles to be contained in the composite thin film of the present invention, fine organic polymer particles may be used. The organic polymer may, for example, be a silicone resin, an acrylic resin or a styrene resin. Such an organic polymer may be obtained in the form of fine particles by e.g. suspension polymerization or supercritical polymerization, but it may be in the form of fine particles produced by another method so long as fine particles are obtained. A desired refractive index of the fine organic polymer particles can be attained by selecting the polymer material.

As the binder in the composite thin film of the present invention, a metal oxide may be used. In such a case, a metal oxide precursor contained as a binder-forming material in a coating material, is converted to a metal oxide as the binder by applying a coating material composition and drying the resulting coating. A metal oxide precursor preferably used may, for example, be an alkoxysilane. The alkoxysilane is hydrolyzed in an acid catalyst to produce a coating liquid, which is dried at 300° C. to obtain silica.

The coating liquid from which silica is obtained, is mixed with the above-described fine particles or fine particle-containing solution to form a solution in a dissolved and/or dispersed state, which is applied and dried to obtain a solid coated film containing the fine particles and the binder in a dispersed state. The binder for the composite thin film of the present invention may, for example, be silica/titania composite oxide, titania, tin oxide, zinc oxide, cerium oxide, aluminum oxide or a composite oxide thereof, as well as silica.

A desired refractive index of the metal oxide as the binder can be attained by selecting a constitutional element of the precursor of the metal oxide. Titania and silica/titania composite oxide can be obtained by drying at 300° C. a coating liquid produced as disclosed in detail in JP-A-05-124818, JP-A-06-033000 and JP-A-06-242432. The coating liquid from which the composite oxide is obtained is mixed with the above-described fine particles or fine particle-containing solution to form a solution in a dissolved and/or dispersed state, which is applied and dried to obtain a solid coated film containing the fine particles and the binder in a dispersed state.

As the binder for the composite thin film of the present invention an organic polymer may be used. The organic polymer may be the same as the polymer constituting the above-described fine organic polymer particles. Accordingly, such a polymer is in a dissolved and/or dispersed state in the liquid coating material and by applying and drying the coating material, a solid coated film containing the fine particles and the binder in a dispersed state is obtained. Namely, in such a case, the organic polymer itself is the binder-forming material and is the binder. Other examples of such a polymer include polymers excellent in transparency such as an acrylic resin and a fluororesin, but the polymer may be one commonly used as an optical thin film coating.

In another embodiment the binder-forming material may be one which is chemically converted to a binder when the coating material is applied and the obtained coating is dried. For example, the binder-forming material may be a reactive (e.g. crosslinkable or polycondensable) organic monomer, organic oligomer or organic prepolymer, which is reacted and converted to an organic polymer as the binder. Accordingly, such an organic monomer, organic oligomer or organic prepolymer is dissolved and/or dispersed as a reactive binder-forming material in the liquid coating material composition. Such an organic monomer, organic oligomer or organic prepolymer preferably used may, for example, be an epoxy monomer, oligomer or prepolymer.

A desired refractive index of the organic polymer can be attained by selecting the organic polymer, or the organic monomer, the organic oligomer or the organic prepolymer which provides the organic polymer.

For the composite thin film-holding substrate for a surface light emitter of the present invention, the combination of the fine particles or the fine particle-containing solution and the binder is selected so that the above-described requirements are satisfied and that the refractive index of the composite thin film is higher than the refractive index of the transparent base material.

Now, embodiments of the present invention will be described in further detail with reference to drawings.

FIG. 1 is a sectional view schematically illustrating one form of the composite thin film (light-extraction film)—holding substrate A according to the first aspect of the present invention. On the surface of a transparent base material 1, a composite thin film 4 constituted by fine particles 2 and a binder 3 is formed. This composite thin film is obtained by applying a liquid coating material which is a mixture of the fine particles or a fine particle-containing solution with a binder-forming coating liquid, on the transparent base material 1 and drying it, followed by baking after irradiation with UV or without irradiation.

The fine particles 2 preferably have a particle size of from 10 nm to 1,000 nm, more preferably at least 80 nm.

The difference in the refractive index between the fine particles 2 and the binder 3 is preferably at least 0.1, more preferably at least 0.3.

The proportion of the fine particles contained in the solid content of the coating material, as represented by (solid content mass of the fine particles 2)/(solid content mass of the binder 3+solid content mass of the fine particles 2), is preferably from 0.01 to 0.5, more preferably from 0.2 to 0.5.

Figure 2:
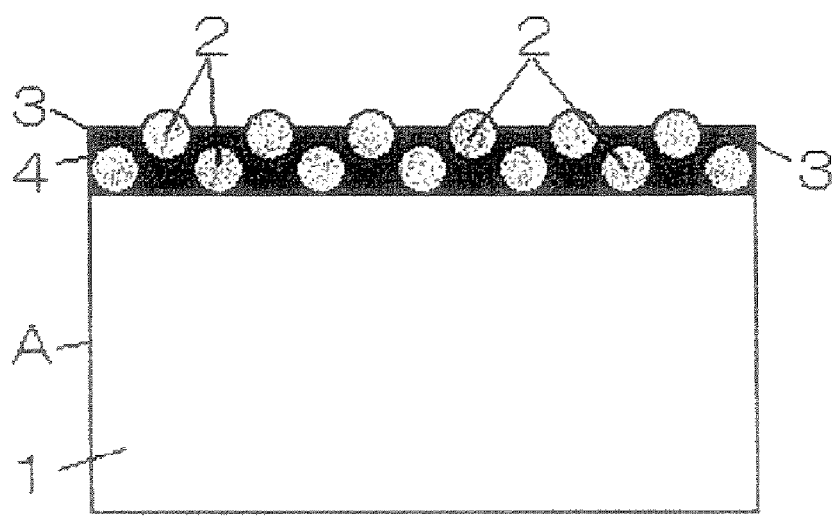
FIG. 2 is a sectional view schematically illustrating another example of the composite thin film-holding substrate for a surface light emitter of the present invention.

FIG. 2 is a sectional view schematically illustrating one form of the composite thin film-holding base material A for a surface light emitter according to the first aspect. On the surface of a transparent base material 1, a composite thin film 4 constituted by fine particles 2 and a binder 3 is formed. This composite thin film is obtained by applying a liquid coating material composition which is a mixture of the fine particles or a fine particle-containing solution with a binder-forming coating liquid on the transparent base material 1 and drying it, followed by baking after irradiation with UV or without irradiation.

The fine particles 2 preferably have an average particle size of from 10 nm to 1,000 nm, more preferably at least 200 nm.

The difference in the refractive index between the fine particles 2 and the binder 3 is preferably at least 0.1, more preferably at least 0.3.

The proportion of the fine particles contained in the solid content of the coating material, as represented by (solid content mass of the fine particles 2)/(solid content mass of the binder 3+solid content mass of the fine particles 2) is preferably from 0.01 to 0.5, more preferably from 0.01 to 0.2.

FIGS. 3(a) and 3(b) are sectional views illustrating one form of the composite thin film-holding substrate B for a surface light emitter according to the second or third aspect, which comprises a planarized film 5 formed on the composite thin film 4 of the composite thin film-holding substrate A for a surface light emitter, by using a planarizing material containing e.g. a metal oxide or an organic polymer, so that irregularities on the surface of the composite thin film are reduced or the surface is planarized. In a case where the irregularities are reduced or the surface is planarized, when the proportion of the fine particles contained in the solid content of the coating material for the composite thin film, as represented by (solid content mass of the fine particles 2)/(solid content mass of the binder 3+solid content mass of the fine particles 2), is from 0.01 to 0.2, an effect of improving the light-extraction efficiency will be achieved even if the refractive index of the planarized film is equal to the refractive index of the composite thin film containing fine particles and a binder, but the refractive index of the planarized film is preferably different from the refractive index of the composite thin film. On the other hand, when the proportion of the fine particles contained in the solid content of the coating material for the composite thin film, as represented by (solid content mass of the fine particles 2)/(solid content mass of the binder 3+solid content mass of the fine particles 2), is from 0.2 to 0.5, the refractive index of the planarized film is preferably different from the refractive index of the composite thin film containing fine particles and a binder by at least 0.2.

After formation of the planarized film, the surface of the planarized film may be polished by polishing such as chemical mechanical polishing (CMP) FIG. 3(a) illustrates a case where a planarized film 5 is provided on the composite thin film-holding substrate A for a surface light emitter shown in FIG. 1, and FIG. 3(b) illustrates a case where a planarized film 5 is provided on the composite thin film-holding substrate A for a surface light emitter shown in FIG. 2.

Figure 3:
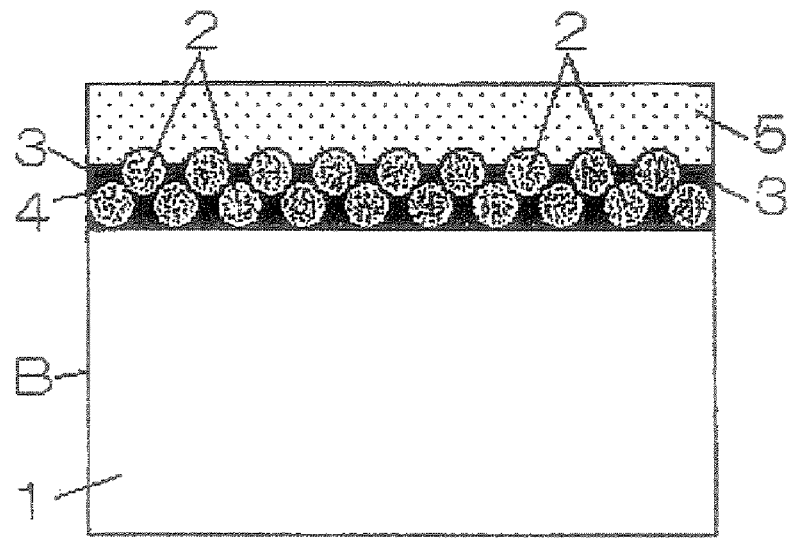
FIGS. 3(a) and 3(b) are sectional views schematically illustrating a form wherein a planarized film is provided on the composite thin film-holding substrate for a surface light emitter shown in FIG. 1 or 2.
Figure 3:
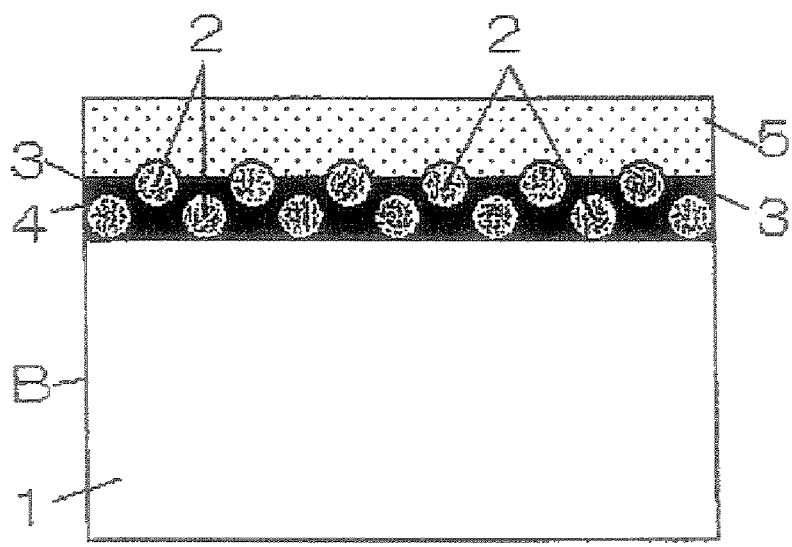
Figure 4A:
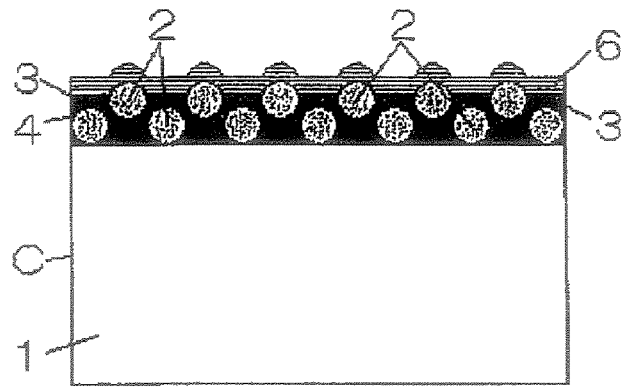
FIGS. 4(a) and 4(b) are sectional views schematically illustrating a form wherein a phosphor thin film is provided on the composite thin film-holding substrate for a surface light emitter shown in FIG. 2 or FIG. 3(a).
Figure 4B:
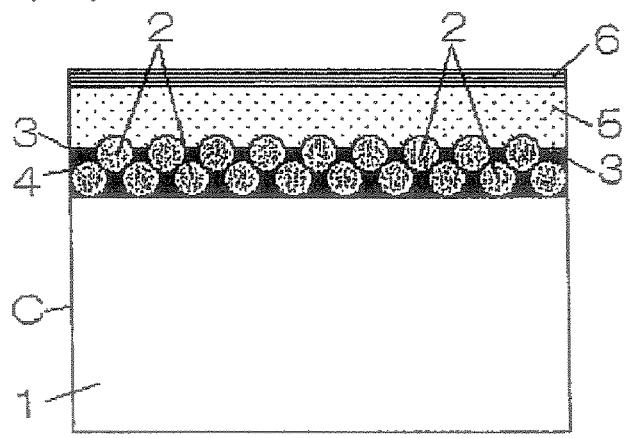

FIGS. 4(a) and 4(b) are sectional views schematically illustrating a surface light emitter C according to the sixth or seventh aspect, which comprises the thin film-holding substrate A or B for a surface light emitter, and a phosphor thin film 6 provided on the composite thin film 4 or the planarized film 5. In FIGS. 4(a) and 4(b), the phosphor thin film 6 is directly provided on the surface of the composite thin film 4 or the planarized film 5 on the opposite side from the transparent base material 1. This thin film 6 contains an organic or inorganic phosphor which is excited by irradiation with ultraviolet rays or by irradiation with electron rays and emits light, and forms a surface light emitter C as a photoluminescence device. This surface light emitter C is particularly useful for a self-luminous display such as CRT, FED or PDP. FIG. 4(a) illustrates a case where a phosphor thin film 6 is provided on the composite thin film-holding substrate A for a surface light emitter shown in FIG. 2, and FIG. 4(b) illustrates a case where a phosphor thin film 6 is provided on the composite thin film-holding substrate B for a surface light emitter shown in FIG. 3(a).

The material of the phosphor is not particularly limited, and an optional organic or inorganic material which has been used for a photoluminescence device can be used. As a method of forming the phosphor thin film 6, in the case of an inorganic phosphor, a sputtering method and a vapor deposition method such as MOCVD method (metal organic chemical vapor deposition method) may be mentioned, in the case of a low molecular weight organic phosphor, a vacuum deposition method may be mentioned, and in the case of a polymer organic phosphor, a coating method such as spin coating or ink jet coating may be mentioned.

Figure 5:
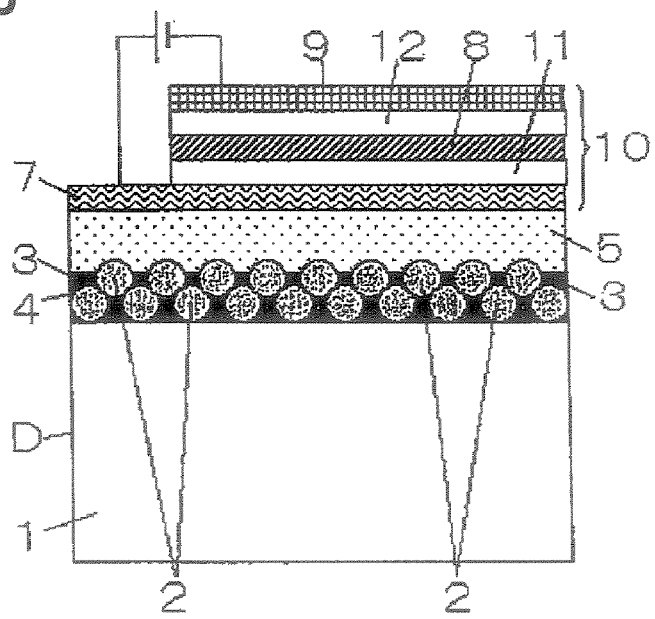
FIG. 5 is a sectional view schematically illustrating a form wherein an electroluminescence device is provided on the composite thin film-holding substrate B for a surface light emitter shown in FIG. 3(a).

FIG. 5 is a sectional view schematically illustrating a surface light emitter D according to the eighth aspect, which comprises the composite thin film-holding substrate B for a surface light emitter, and a transparent electrically conductive film 7, a luminous layer 8 and a metal electrode 9 multilayered on the planarized film 5 to form an electroluminescence device 10. Namely, the device 10 is formed on the composite thin film-holding substrate B for a surface light emitter. The electroluminescence device 10 comprises the transparent electrically conductive film 5 as an anode and the metal electrode 9 made of a metal thin film as a cathode, and has the luminous layer 8 multilayered between the anode and the cathode. FIG. 5 illustrates an organic electroluminescence device 10, which has a hole transport layer 11 multilayered between the transparent electrically conductive film 7 as the anode and the luminous layer 8, and as the case requires, an electron transport layer 12 multilayered between the luminous layer 8 and the metal electrode 9 as the cathode. In the case of an inorganic electroluminescence 10, a dielectric layer is multilayered on one side or on both sides of the luminous layer 8. As materials of the luminous layer 8, the metal electrode 9, the hole transport layer 11 and the electron transport layer 12, conventional materials used for production of an electroluminescence can be used.

Here, FIG. 5 illustrates a case where an organic electroluminescence device 10 is provided on the composite thin film-holding substrate B for a surface light emitter shown in FIG. 3. The organic electroluminescence device 10 provides light emission in such a manner that a positive voltage is applied to the transparent electrically conductive film 7 as the anode and a negative voltage is applied to the metal electrode 9 as the cathode, whereupon electrons injected into the luminous layer 8 via the electron transport layer 12 and holes injected into the luminous layer 8 via the hole transport layer 11 are recombined in the luminous layer 8 to generate light emission.

EXAMPLES

Now, the present invention will be described in further detail with reference to Examples.

Fine silica particles as the fine particles were produced by a known method disclosed in Bogush, G. H.; et al, "Preparation of monodisperse silica particles: control of size and mass fraction", Journal of Non-crystalline Solids, 104 (1988) 95-106. The prepared fine particles had a refractive index of about 1.38.

To measure the average particle size, DLS-7000 manufactured by OTSUKA ELECTRONICS CO., LTD. was used as a dynamic light scattering particle size measuring apparatus.

Example 1

86.95 g of titanium tetraisopropoxide was added to 260.84 g of hexylene glycol (HG), followed by stirring at room temperature for 30 minutes to prepare precursor solution BA-1. 13.78 g of water and 68.53 g of ethylene is glycol (EG) were mixed, and 58.76 g of aluminum nitrate was dissolved therein. Further, 186.23 g of 2-butoxyethanol (BS) and 229.31 g of HG were added thereto and mixed. 95.60 g of tetraethoxysilane (TEOS) was added thereto, followed by stirring for 30 minutes, and then the precursor solution BA-1 was added thereto, followed by stirring for 30 minutes to prepare binder solution BA-2.

157.94 g of titanium tetraisopropoxide was added to 473.82 g of hexylene glycol (HG), followed by stirring at room temperature for 30 minutes to prepare precursor solution BB-1. 12.52 g of water and 68.75 g of ethylene glycol (EG) were mixed, and 53.37 g of aluminum nitrate was dissolved therein. Further, 186.81 g of 2-butoxyethanol (BS) and 17.86 g of HG were added thereto and mixed. 186.81 g of 2-butoxyethanol (BS) and 17.86 g of HG were added thereto and mixed. Further, 28.94 g of tetraethoxysilane (TEOS) was added thereto, followed by stirring for 30 minutes, and the precursor solution BA-1 was added thereto, followed by stirring for 30 minutes to prepare binder solution BB-2.

The binder solutions BA-2 and BB-2 were respectively applied on silicon single crystal substrates, followed by baking at 300° C. for 30 minutes, and the refractive indices of the obtained silica/titania composite oxide films were measured by means of an automatic ellipsometer model DVA-36L, manufactured by MIZOJIRI OPTICAL CO., LTD and as a result, they were 1.60 and 1.82.

661.75 g of ethanol and 208 g of TEOS were mixed, and 126 g of water and 4.25 g of ammonia water (concentration 28 wt %) were added thereto at 40° C., followed by stirring at 40° C. for four days to prepare particle-containing solution RA-1. 435 g of HG was added to 500 g of the prepared RA-1, and the mixture was concentrated to 300 g to prepare fine silica particle-containing solution RA-2. The particle size was measured by DLS-7000 manufactured by OTSUKA ELECTRONICS CO., LTD., whereupon it was 20 nm.

548.59 g of ethanol and 277.76 g of TEOS were mixed, and 168 g of water and 5.65 g of ammonia water (concentration: 28 wt %) were added thereto at 40° C., followed by stirring at 40° C. for 7 hours to prepare particle-containing solution RB-1. 445 g of HG was added to 500 g of the prepared RB-1, and the mixture was concentrated to 500 g to prepare fine silica particle-containing solution RB-2. The particle size was measured by DLS-7000 manufactured by OTSUKA ELECTRONICS CO., LTD., whereupon it was 80 nm.

445 g of ethanol and 345 g of TEOS were mixed, and 200 g of water and 10 g ammonia water (concentration: 28 wt %) were added at 40° C., followed by stirring at 40° C. for 7 hours to prepare particle-containing solution RC-1. 455 g of HG was added to 500 g of the prepared RC-1, and the mixture was concentrated to 500 g to prepare fine silica particle-containing solution RC-2. The particle size was measured by DLS-7000 manufactured by OTSUKA ELECTRONICS CO., LTD., whereupon it was 210 nm.

Either of the binder solutions BA-2 and BB-2 and any one of the fine silica particle-containing solutions RA-2, RB-2 and RC-2 were mixed in a mass ratio of the solid content of 50/50, 20/80 or 93.4/6.6, and the mixture was diluted with an optional solvent so that the solid content would be 6%, to prepare coating solutions. The respective coating solutions, binder solutions, fine silica particle-containing solutions and mixing ratios (mass ratios of solid content) are shown in Table 1.

TABLE 1

| Coating material | Binder solution | Fine silica particle-containing solution | Mixing ratio binder solution/fine silica particle-containing solution |
|---|---|---|---|
| SC-AA (5) | BA-2 | RA-2 | 50/50 |
| SC-AA (2) | BA-2 | RA-2 | 20/80 |
| SC-AA (1) | BA-2 | RA-2 | 93.4/6.6 |
| SC-AB (5) | BA-2 | RB-2 | 50/50 |
| SC-AB (2) | BA-2 | RB-2 | 20/80 |
| SC-AB (1) | BA-2 | RB-2 | 93.4/6.6 |
| SC-AC (5) | BA-2 | RC-2 | 50/50 |
| SC-AC (2) | BA-2 | RC-2 | 20/80 |
| SC-AC (1) | BA-2 | RC-2 | 93.4/6.6 |
| SC-BA (5) | BB-2 | RA-2 | 50/50 |
| SC-BA (2) | BB-2 | RA-2 | 20/80 |
| SC-BA (1) | BB-2 | RA-2 | 93.4/6.6 |
| SC-BB (5) | BB-2 | RB-2 | 50/50 |
| SC-BB (2) | BB-2 | RB-2 | 20/80 |
| SC-BB (1) | BB-2 | RB-2 | 93.4/6.6 |
| SC-BC (5) | BB-2 | RC-2 | 50/50 |
| SC-BC (2) | BB-2 | RC-2 | 20/80 |
| SC-BC (1) | BB-2 | RC-2 | 93.4/6.6 |

Each of the above prepared coating solutions was applied on a glass substrate (#1737) manufactured by Corning Incorporated by spin coating, followed by baking at 300° C. for 30 minutes to prepare composite thin film-holding glass substrates having a structure shown in FIGS. 1 and 2. On each of the composite thin film-holding glass substrates, a film of tris(8-hydroxyquinoline) aluminum (III) (Alq-3) was formed by vapor deposition. The refractive index of the glass substrate used was 1.50.

Comparative Example 1

The glass plate used in Example 1 was used as untreated, and a film of tris(8-hydroxyquinoline) aluminum (III) (Alq-3) was formed by vapor deposition on the untreated glass substrate.

Comparative Example 2

150 g of water and 167.09 g of ethanol were mixed, and 1.50 g of oxalic acid was dissolved therein to prepare solution BC-1. 334.19 g of ethanol and 347.22 g of TEOS were mixed, and the solution BB-1 was dropwise added thereto at room temperature over a period of about 30 minutes, followed by stirring at room temperature for 30 minutes. Then, reflux was carried out with stirring for one hour to prepare binder solution BC-2.

The binder solution BC-2 was applied to a silicon single crystal substrate, followed by baking at 300° C. for 30 minutes, and the refractive index of the obtained silica film was measured by an automatic ellipsometer model DVA-36L, manufactured by MIZOJIRI OPTICAL CO., LTD., whereupon it was 1.43.

Either of the binder solutions BB-2 and BC-2 and any one of the fine silica particle-containing solutions RA-2, RB-2 and RC-2 prepared in Example 1 were mixed in a mass ratio of the solid content of 50/50, 20/80 or 93.4/6.6 and the mixture was diluted with an optional solvent so that the solid content would be 6% to prepare coating solutions. The respective coating solutions, binder solutions, fine particle-containing solutions and mixing ratios (mass ratios of solid content) are shown in Table 2.

TABLE 2

| Coating material | Binder solution | Fine particle-containing solution | Mixing ratio binder solution/fine particle-containing solution |
|---|---|---|---|
| CC-CA (5) | BC-2 | RA-2 | 50/50 |
| CC-CA (2) | BC-2 | RA-2 | 20/80 |
| CC-CA (1) | BC-2 | RA-2 | 93.4/6.6 |
| CC-CB (5) | BC-2 | RB-2 | 50/50 |
| CC-CB (2) | BC-2 | RB-2 | 20/80 |
| CC-CB (1) | BC-2 | RB-2 | 93.4/6.6 |
| CC-CC (5) | BC-2 | RC-2 | 50/50 |
| CC-CC (2) | BC-2 | RC-2 | 20/80 |
| CC-CC (1) | BC-2 | RC-2 | 93.4/6.6 |

Each of the above prepared coating solutions was applied on a glass substrate (#1737) manufactured by Corning Incorporated by spin coating, followed by baking at 300° C. for 30 minutes to prepare composite thin film-holding glass substrates having structures shown in FIGS. 1 and 2. A film of tris(8-hydroxyquinoline) aluminum (III) (Alq-3) was formed on each of the composite thin film-holding glass substrates by vapor deposition.

Comparative Example 3

Figure 6A:
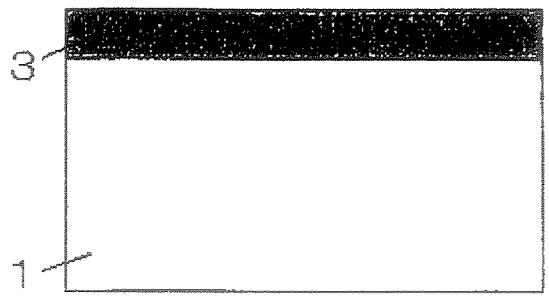
FIGS. 6(a) and 6(b) are sectional views schematically illustrating one example of a binder film-holding glass substrate, and in FIG. 6(b), a luminous thin film is provided.
Figure 6B:
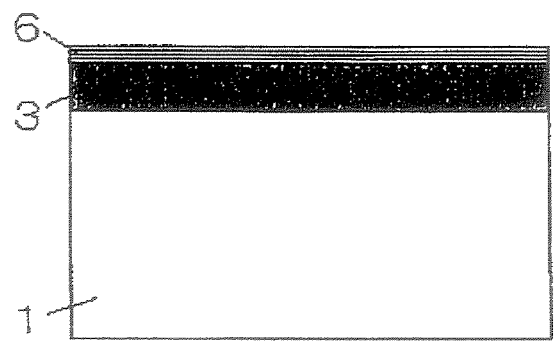

Each of the binder solutions BA-2, BB-2 and BC-2 prepared in Example 1 and Comparative Example 2 was applied to the glass substrate used in Example 1 by spin coating, followed by baking at 300° C. for 30 minutes, and this operation was repeatedly carried out to prepare binder film-holding glass substrates as shown in FIG. 6(a) with a film thickness of about 1 µm. This Example corresponds to Comparative Example 3. A film of tris(8-hydroxyquinoline) aluminum (III) (Alq-3) was formed on each of the prepared binder film-holding glass substrates by vapor deposition to prepare surface light emitters shown in FIG. 6(b).

Figure 7:
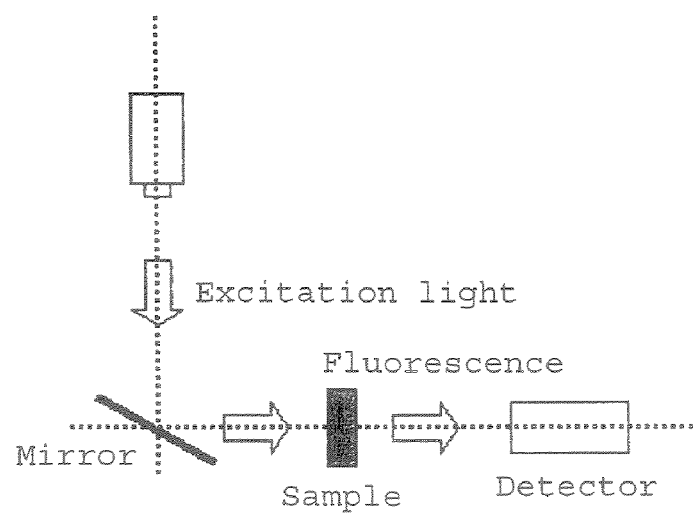
FIG. 7 is a diagram illustrating disposition of a sample in a spectrophotofluorometer.

Each of the composite thin film-holding glass substrates having a phosphor film formed thereon, prepared in Example 1 and Comparative Examples 2 and 3, and a glass substrate having a phosphor film formed thereon, prepared in Comparative Example 1, was disposed in a spectrofluorometer F-4010 manufactured by Hitachi, Ltd., as shown in FIG. 7, and the substrate was irradiated with excitation light at right angles, and fluorescence emitted from the substrate was detected by a detector placed at right angles with the substrate to measure the maximum fluorescence intensity.

(The maximum fluorescence intensity of each of the composite thin film-holding glass substrates having a phosphor film formed thereon prepared in Example 1 and Comparative Examples 2 and 3/the maximum fluorescence intensity of the glass substrate having a phosphor film formed thereon prepared in Comparative Example 1), which is a change of the maximum fluorescence intensity of each of the composite thin film-holding glass substrates having a phosphor film formed thereon, prepared in Example 1 and Comparative Examples 2 and 3, to the maximum fluorescence intensity of the glass substrate having a phosphor film formed thereon prepared in Comparative Example 1, was calculated and the results are shown in Tables 3, 4 and 5.

Further, the haze value indicating the degree of scattering was measured by a hazemeter TC-1800H manufactured by Tokyo Denshoku CO., LTD. by a method disclosed in JIS K7136 and JIS K7161-1, and the results are shown in Tables 3, 4 and 5.

TABLE 3

Example 1

| Coating material | Composition of coating material | Change of maximum fluorescence intensity | HAZE (%) |
|---|---|---|---|
| SC-AA (5) | BA-2/RA-2 = 50/50 | 0.96 | 0.0 |
| SC-AA (2) | BA-2/RA-2 = 80/20 | 1.01 | 0.0 |
| SC-AA (1) | BA-2/RA-2 = 93.4/6.6 | 0.99 | 0.0 |
| SC-AB (5) | BA-2/RB-2 = 50/50 | 1.12 | 0.1 |
| SC-AB (2) | BA-2/RB-2 = 80/20 | 1.16 | 0.2 |
| SC-AB (1) | BA-2/RB-2 = 93.4/6.6 | 1.07 | 0.1 |
| SC-AC (5) | BA-2/RC-2 = 50/50 | 1.34 | 13.0 |
| SC-AC (2) | BA-2/RC-2 = 80/20 | 1.28 | 6.7 |
| SC-AC (1) | BA-2/RC-2 = 93.4/6.6 | 1.12 | 2.3 |
| SC-BA (5) | BB-2/RA-2 = 50/50 | 0.95 | 0.0 |
| SC-BA (2) | BB-2/RA-2 = 80/20 | 1.04 | 0.0 |
| SC-BA (1) | BB-2/RA-2 = 93.4/6.6 | 1.02 | 0.0 |
| SC-BB (5) | BB-2/RB-2 = 50/50 | 1.17 | 0.2 |
| SC-BB (2) | BB-2/RB-2 = 80/20 | 1.32 | 0.5 |
| SC-BB (1) | BB-2/RB-2 = 93.4/6.6 | 1.12 | 0.2 |
| SC-BC (5) | BB-2/RC-2 = 50/50 | 1.52 | 13.6 |
| SC-BC (2) | BB-2/RC-2 = 80/20 | 1.60 | 11.8 |
| SC-BC (1) | BB-2/RC-2 = 93.4/6.6 | 1.27 | 7.4 |

TABLE 4

Comparative Example 2

| Coating material | Composition of coating material | Change of maximum fluorescence intensity | HAZE (%) |
|---|---|---|---|
| CC-CA (5) | BC-2/RA-2 = 50/50 | 0.97 | 0.0 |
| CC-CA (2) | BC-2/RA-2 = 80/20 | 0.95 | 0.0 |
| CC-CA (1) | BC-2/RA-2 = 93.4/6.6 | 0.97 | 0.0 |
| CC-CB (5) | BC-2/RB-2 = 50/50 | 1.24 | 0.5 |
| CC-CB (2) | BC-2/RB-2 = 80/20 | 1.04 | 0.1 |
| CC-CB (1) | BC-2/RB-2 = 93.4/6.6 | 1.05 | 0.1 |
| CC-CC (5) | BC-2/RC-2 = 50/50 | 1.41 | 16.8 |
| CC-CC (2) | BC-2/RC-2 = 80/20 | 1.16 | 10.0 |
| CC-CC (1) | BC-2/RC-2 = 93.4/6.6 | 1.06 | 3.7 |

TABLE 5

Comparative Example 3

| Coating material | Change of maximum fluorescence intensity | HAZE (%) |
|---|---|---|
| BA-2 | 0.98 | 0.0 |
| BB-2 | 0.98 | 0.0 |
| BC-2 | 0.86 | 0.0 |

Example 2

59.02 g of TEOS and 202.07 g of methyltriethoxysilane were mixed to prepare O-1. 204.00 g of oxalic acid was dissolved in 534.91 g of ethanol, and the solution O-1 was dropwise added thereto at from 15 to 20° C. over a period of about 45 minutes, followed by reflux with stirring for 5 hours to prepare O-2 coating solution. 40 g of propylene glycol monomethyl ether was added to 141.18 g of the O-2 coating solution, followed by concentration at 60° C. by evaporation to 100 g, to prepare O-3 coating solution.

Each of the composite thin film-holding glass substrates employing SC-BC (5), SC-BC (2) and SC-BB (2) prepared in Example 1, was further overcoated with the O-3 coating solution as a planarizing material, followed by baking at 300° C. for 30 minutes to prepare composite thin film-holding glass substrates overcoated with O-3 having a planarized film formed thereon having a structure shown in FIGS. 3(a) and 3(b).

The O-3 coating solution was applied to a silicon single crystal substrate, followed by baking at 300° C. for 30 minutes, and the refractive index of the obtained silica film was measured by an automatic ellipsometer model DVA-36L, manufactured by MIZOJIRI OPTICAL CO., LTD., whereupon it was 1.38.

A film of tris(8-hydroxyquinoline) aluminum (III) (Alq-3) was formed on each of the composite thin film-holding glass substrates overcoated with O-3 by vapor deposition.

Example 3

Each of the composite thin film-holding glass substrates employing SC-BC (5), SC-BC (2) and SC-BB (2) prepared in Example 1, was overcoated with SE-812 manufactured by Nissan Chemical Industries, Ltd as a planarizing material, followed by baking at 250° C. for one hour to prepare composite thin film-holding glass substrates overcoated with SE-812 having a structure shown in FIGS. 3(a) and 3(b).

SE-812 was applied on a silicon single crystal substrate, followed by baking at 250° C. for 10 minutes and the refractive index of the obtained SE-812 coating film was measured by an automatic ellipsometer model DVA-36L, manufactured by MIZOJIRI OPTICAL CO., LTD., whereupon it was 1.64.

A film of tris(8-hydroxyquinoline) aluminum (III) (Alq-3) was formed on each of the composite thin film-holding glass substrates overcoated with SE-812 by vapor deposition.

Comparative Example 4

The composite thin film-holding glass substrate employing CC-CC (5) prepared in Comparative Example 2 was further overcoated with the O-3 coating solution as a planarizing material, followed by baking at 300° C. for 30 minutes to prepare a composite thin film-holding glass substrate overcoated with O-3 having a structure shown in FIGS. 3(a) and 3(b).

A film of tris(8-hydroxyquinoline) aluminum (III) (Alq-3) was formed on the composite thin film-holding glass substrate overcoated with O-3 by vapor deposition.

Comparative Example 5

The composite thin film-holding glass substrate employing CC-CC (5) prepared in Comparative Example 2 was overcoated with SE-812 manufactured by Nissan Chemical Industries, Ltd. as a planarizing material, followed by baking at 250° C. for one hour to prepare a composite thin film-holding glass substrate overcoated with SE-812 having a structure shown in FIGS. 3(a) and 3(b).

A film of tris(8-hydroxyquinoline) aluminum (III) (Alq-3) was formed on the composite thin film-holding glass substrate overcoated with SE-812 by vapor deposition.

Each of the composite thin film-holding glass substrates having a phosphor film formed thereon, prepared in Examples 2 and 3 and Comparative Examples 4 and 5, and a glass substrate having a phosphor film formed thereon, prepared in Comparative Example 1, was disposed in a spectrofluorometer F-4010 manufactured by Hitachi, Ltd., as shown in FIG. 7 and the substrate was irradiated with excitation light at right angles, and fluorescence emitted from the substrate was detected by a detector placed at right angles with the substrate to measure the maximum fluorescence intensity.

(The maximum fluorescence intensity of each of the composite thin film-holding glass substrates having a phosphor film formed thereon prepared in Examples 2 and 3 and Comparative Examples 4 and 5/the maximum fluorescence intensity of the glass substrate having a phosphor film formed thereon prepared in Comparative Example 1), which is a change of the maximum fluorescence intensity of each of the composite thin film-holding glass substrates having a phosphor film formed thereon, prepared in Examples 2 and 3 and Comparative Examples 4 and 5, to the maximum fluorescence intensity of the glass substrate having a phosphor film formed thereon prepared in Comparative Example 1, was calculated and the results are shown in Tables 6 and 7.

Further, the haze value indicating the degree of scattering was measured by a hazemeter TC-1800H manufactured by Tokyo Denshoku CO., LTD. by a method disclosed in JIS K7136 and JIS K7161-1, and the results are shown in Tables 6 and 7.

TABLE 6

| Coating material | Composition of coating material | Overcoat material | Change of maximum fluorescence intensity | HAZE (%) |
|---|---|---|---|---|
| | | Example 2 | | |
| SC-BB (2) | BB-2/RB-2 = 80/20 | O-3 | 1.28 | 0.6 |
| SC-BC (5) | BB-2/RC-2 = 50/50 | O-3 | 1.14 | 1.6 |
| SC-BC (2) | BB-2/RC-2 = 80/20 | O-3 | 1.46 | 2.9 |
| | | Comparative Example 4 | | |
| CC-CC (5) | BC-2/RC-2 = 50/50 | O-3 | 1.03 | 2.7 |

TABLE 7

| Coating material | Composition of coating material | Overcoat material | Change of maximum fluorescence intensity | HAZE (%) |
|---|---|---|---|---|
| | | Example 3 | | |
| SC-BB (2) | BB-2/RB-2 = 80/20 | SE-812 | 1.03 | 0.5 |
| SC-BC (5) | BB-2/RC-2 = 50/50 | SE-812 | 1.31 | 3.5 |
| SC-BC (2) | BB-2/RC-2 = 80/20 | SE-812 | 1.30 | 3.1 |
| | | Comparative Example 5 | | |
| CC-CC (5) | BC-2/RC-2 = 50/50 | SE-812 | 1.19 | 4.2 |

With respect to the composite thin film-holding substrate for a surface light emitter in Example 1 of the present invention, a composite thin film obtained from a coating material containing fine particles and a binder differing in the refractive index by at least 0.1, is formed on the surface of a transparent base material whereby the light-extraction efficiency can be significantly improved. When light passes through the composite thin film, it is scattered on the surface of the film and in the interior of the film. By such an effect when a light emitting device is provided on the composite thin film of the composite thin film-holding substrate for a surface light emitter, the light guided into the light emitting device tends to be reduced and the extraction efficiency of the light passing through the composite thin film from the transparent base material to the outside (the air) tends to be high.

In the composite thin film-holding substrate for a surface light emitter in Example 1 of the present invention, in a case where the refractive index of the fine particles forming the composite thin film is 1.38 and the refractive indices of the binder are 1.60 and 1.82, when the proportions of the fine particles contained in the coating material, as represented by the solid content mass of the fine particles/(solid content mass of the binder+solid content mass of the fine particles) are 0.5, 0.2 and 0.066, the refractive indices of the composite thin films are 1.49, 1.56 and 1.59, and 1.60, 1.73 and 1.79, respectively, as calculated from [refractive index of the film=(solid content mass ratio of the fine particles)×1.38+(solid content mass ratio of the binder)×(refractive index of the binder)] to obtain approximate values. That is, the refractive index of the composite thin film is equal to or higher than that of the glass substrate (transparent base material). Also in a case where the refractive index of the composite thin film is equal to or higher than that of the transparent base material, the extraction efficiency of the light passing through the composite thin film from the transparent base material to the outside (the air) tends to be high.

In Comparative Example 2, since the refractive index of the fine particles is 1.38, and the refractive indices of the binders are 1.43 and 1.60, in a case where the proportions of the fine particles contained in the solid content of the coating material, as represented by the solid content mass of the fine particles/(solid content mass of the binder+solid content mass of the fine particles) are 0.5, 0.2 and 0.66, the refractive indices of the composite thin films are 1.41, 1.42 and 1.43, respectively, as calculated from [refractive index of the film= (solid content mass ratio of the fine particles)×1.38+(solid content mass ratio of the binder)×refractive index of the binder] to obtain approximate values, and thus the refractive index of the composite thin film is lower than that of the glass substrate.

With respect to the composite thin film-holding substrate for a surface light emitter in Example 1 of the present invention, in a case where the refractive index of the fine particles forming the composite thin film is 1.38 and the refractive index of the binder is 1.60, a great effect of improving the light extraction efficiency is achieved particularly as compared with Comparative Example 2 when the refractive index of the composite thin film is higher than the refractive index of the glass substrate.

With respect to the composite thin film in Example 1 of the present invention, in a case where the refractive index of the fine particles forming the composite thin film is 1.38, a greater effect of improving the light-extraction efficiency is achieved when the refractive index of the binder is 1.87 than when it is 1.60. This is because the difference in the refractive index between the fine particles and the binder is at least 0.3 and is greater.

As shown in Comparative Example 3, in the case of a composite thin film and a planarized film having equal refractive index, no effect of increasing the extraction efficiency of the light passing through the composite thin film from the transparent base material to the outside (the air) is achieved at all.

With respect to the composite thin film in Example 1, when the particle size of the fine particles used is at least 200 nm, scattering occurs more actively, and a higher effect of improving the light-extraction efficiency of the composite thin film containing fine particles and a binder is achieved.

With respect to the composite thin film in Example 1 when the proportion of the fine particles contained in the solid content of the coating material as represented by the solid content mass of the fine particles/(solid content mass of the binder+solid content mass of the fine particles) is about 0.2 and the fine particles and the binder properly coexist in the film, a higher effect of improving the light-extraction efficiency of the composite thin film containing fine particles and a binder is achieved.

In the case of the composite thin film-holding substrates for a surface light emitter of which the ratio of (solid content mass of the fine particles)/(solid content mass of the binder+ solid content mass of the fine particles) is at least 0.01 and at most 0.2 in Examples 2 and 3, when the refractive index of the planarized film formed on the composite thin film is equal to the refractive index of the composite thin film the effect of improving the light-extraction efficiency by scattering on the surface of the film significantly decreases. When the refractive index of the planarized film is greatly different from the refractive index of the composite thin film, the effect decreases but is maintained. No effect of improving the light-extraction efficiency is achieved when the refractive index of the fine particles is substantially equal to that of the binder and when the refractive index of the planarizing material for planarization is substantially equal to the refractive index of the composite thin film itself in Comparative Example 2. Thus, it is considered that the effect is maintained by scattering in the interior of the film in the case of the composite thin film in Example 1. The effect of improving the light-extraction efficiency varies depending upon the degree of the difference in the refractive index between the composite thin film and a layer covering the film, and the difference in the refractive index is greatest between the air and the composite thin film, and thus the greatest effect is achieved when there is no film covering the composite thin film.

In Comparative Example 4, when the refractive index of the composite film is substantially equal to the refractive index of the planarized film the effect of improving the light-extraction efficiency is lost by formation of a planarized film. However, with respect to the composite thin film-holding substrates for a surface light emitter of which the ratio of (solid content mass of the fine particles)/(solid content mass of the binder+solid content mass of the fine particles) is at least 0.01 and at most 0.2 in Examples 2 and 3, the effect is maintained when the refractive index of the composite thin film is different from the refractive index of the planarized film. The degree of the effect maintained is more remarkable when the difference in the refractive index between the planarized film and the composite thin film is greater.

With respect to the composite thin film-holding substrate for a surface light emitter of which the ratio of (solid content mass of the fine particles)/(solid content mass of the binder+ solid content mass of the fine particles) is at least 0.01 and at most 0.2 in Example 3 when the refractive index of the composite film is substantially equal to the refractive index of the planarized film, the effect of improving the light-extraction efficiency is lost when the particle size is 80 nm, but the effect is maintained when fine particles having a particle size of 200 nm are used.

With respect to the composite thin film-holding substrates for a surface light emitter of which the ratio of (solid content mass of the fine particles)/(solid content mass of the binder+solid content mass of the fine particles) is higher than 0.2 and at most 0.5 in Examples 2 and 3, when the refractive index of the planarized film formed on the composite thin film is equal to the refractive index of the composite thin film, the effect of improving the light-extraction efficiency by scattering on the surface of the film decreases, but when the refractive indices are greatly different, the is effect is maintained. The effect of improving the light-extraction efficiency varies depending upon the degree of the difference in the refractive index between the composite thin film and a film covering the film, and the difference in the refractive index is greatest between the air and the composite thin film, and thus the greatest effect is achieved when there is no film covering the composite thin film.

In Comparative Example 4, when the refractive index of the composite thin film is substantially equal to the refractive index of the planarized film, the effect of improving the light-extraction efficiency is lost by formation of the planarized film, but with respect to the composite thin film-holding substrate for a surface light emitter of which the ratio of (solid content mass of the fine particles)/(solid content mass of the binder+solid content mass of the fine particles) is higher than 0.2 and at most 0.5 in Example 2, the effect is maintained when the refractive index of the composite film is different from the refractive index of the planarized film.

With respect to the composite thin film-holding substrate for a surface light emitter of which the ratio of (solid content mass of the fine particles)/(solid content mass of the binder+solid content mass of the fine particles) is higher than 0.2 and at most 0.5 in Example 3, in a case where fine particles having a particles size of 200 nm are used, even when the difference in the refractive index between the composite thin film and the planarized film is small, the effect of improving the light-extraction efficiency is maintained by scattering in the interior of the film when the difference between the refractive index of the fine particles and the refractive index of the binder is great.

INDUSTRIAL APPLICABILITY

It is to provide a transparent substrate for a surface light emitter capable of improving the light-extraction efficiency of a surface light emitter to be used for various displays represented by organic electroluminescence devices, display devices, backlight and lighting for liquid crystal, etc., and to provide a surface light emitter with a high luminous efficiency by using it.

The entire disclosure of Japanese Patent Application No. 2004-155743 filed on May 26, 2004 including specification, claims, drawings and summary is incorporated herein by reference in its entirety.

The invention claimed is:

1. A composite thin film-holding substrate for a surface light emitter, which is a transparent substrate comprising a composite thin film containing fine particles and a binder formed on the surface of a transparent base material, wherein the refractive index of the composite thin film is higher than the refractive index of the transparent base material, the difference in the refractive index between the fine particles and the binder contained in the composite thin film is at least 0.1, and the ratio of (solid content mass of the fine particles)/(solid content mass of the binder+solid content mass of the fine particles) of the composite thin film is from 0.01 to 0.5.

2. The composite thin film-holding substrate for a surface light emitter according to claim 1, which comprises a planarized film formed on the surface of the composite thin film containing fine particles and a binder, of which the ratio of (solid content mass of the fine particles)/(solid content mass of the binder+solid content mass of the fine particles) is at least 0.01 and at most 0.2.

3. The composite thin film-holding substrate for a surface light emitter according to claim 1, which comprises a planarized film differing in the refractive index by at least 0.2 from the composite thin film, formed on the surface of the composite thin film containing fine particles and a binder, of which the ratio of (solid content mass of the fine particles)/(solid content mass of the binder+solid content mass of the fine particles) is higher than 0.2 and at most 0.5.

4. The composite thin film-holding substrate for a surface light emitter according to claim 1, which further comprises a transparent electrically conductive film formed on the surface of the composite thin film containing fine particles and a binder.

5. The composite thin film-holding substrate for a surface light emitter according to claim 1, wherein the fine particles are fine metal oxide particles or fine organic polymer particles.

6. The composite thin film-holding substrate for a surface light emitter according to claim 1, wherein the fine particles are fine particles of at least one metal oxide selected from the group consisting of silica, titania, tin oxide, zinc oxide, cerium oxide, aluminum oxide, indium oxide and a composite oxide thereof.

7. The composite thin film-holding substrate for a surface light emitter according to claim 1, wherein the binder is a metal oxide or an organic polymer.

8. The composite thin film-holding substrate for a surface light emitter according to claim 1, wherein the binder is at least one metal oxide selected from the group consisting of silica, titania, tin oxide, zinc oxide, cerium oxide, aluminum oxide and a composite oxide thereof.

9. A surface light emitter, which comprises the composite thin film-holding substrate for a surface light emitter as defined in claim 1, and a phosphor thin film multilayered on the surface of the composite thin film containing fine particles and a binder.

10. The composite thin film-holding substrate for a surface light emitter according to claim 2, which further comprises a transparent electrically conductive film formed on the planarized film.

11. The composite thin film-holding substrate for a surface light emitter according to claim 2, wherein the planarized film on the composite thin film is made of a metal oxide or an organic polymer.

12. The composite thin film-holding substrate for a surface light emitter according to claim 2, wherein the planarized film on the composite thin film is made of at least one metal oxide selected from the group consisting of silica, titania, tin oxide, zinc oxide, cerium oxide, aluminum oxide and a composite oxide thereof.

13. The composite thin film-holding substrate for a surface light emitter according to claim 2, wherein the planarized film on the composite thin film is made of at least one organic polymer selected from the group consisting of a silicone resin, an acrylic resin, a styrene resin, a polyimide resin and a polyamide resin.

14. The composite thin film-holding substrate for a surface light emitter according to claim 2, wherein the fine particles are fine silica particles, the binder is silica/titania composite oxide, and the planarized film on the composite thin film is made of silica.

15. A surface light emitter, which comprises the composite thin film-holding substrate for a surface light emitter as defined in claim 2, and a phosphor thin film multilayered on the surface of the planarized film.

16. The composite thin film-holding substrate for a surface light emitter according to claim 3, wherein the planarized film on the composite thin film is made of a metal oxide or an organic polymer.

17. The composite thin film-holding substrate for a surface light emitter according to claim 3, wherein the planarized film on the composite thin film is made of at least one metal oxide selected from the group consisting of silica, titania, tin oxide, zinc oxide, cerium oxide, aluminum oxide and a composite oxide thereof.

18. The composite thin film-holding substrate for a surface light emitter according to claim 3, wherein the planarized film on the composite thin film is made of at least one organic polymer selected from the group consisting of a silicone resin, an acrylic resin, a styrene resin, a polyimide resin and a polyamide resin.

19. The composite thin film-holding substrate for a surface light emitter according to claim 3, wherein the fine particles are fine silica particles, the binder is silica/titania composite oxide, and the planarized film on the composite thin film is made of silica.

20. A surface light emitter, which comprises the composite thin film-holding substrate for a surface light emitter as defined in claim 3, and a phosphor thin film multilayered on the surface of the planarized film.

21. The composite thin film-holding substrate for a surface light emitter according to claim 3, which further comprises a transparent electrically conductive film formed on the planarized film.

22. A surface light emitter, which comprises the composite thin film-holding substrate for a surface light emitter as defined in claim 4, and an electroluminescence device constituted on the surface of the transparent electrically conductive film.

23. A surface light emitter, which comprises the composite thin film-holding substrate for a surface light emitter as defined in claim 10, and an electroluminescence device constituted on the surface of the transparent electrically conductive film.

* * * * *